United States Patent
Li et al.

(10) Patent No.: US 8,822,819 B2
(45) Date of Patent: Sep. 2, 2014

(54) SERVER ENCLOSURE

(75) Inventors: Nai-Juan Li, Wuhan (CN); Zhi-Ping Wu, Wuhan (CN)

(73) Assignees: Hong Fu Jin Precision Industry (WuHan) Co., Ltd., Wuhan (CN); Hon Hai Precision Industry Co., Ltd., New Taipei (TW)

( * ) Notice: Subject to any disclaimer, the term of this patent is extended or adjusted under 35 U.S.C. 154(b) by 236 days.

(21) Appl. No.: 13/408,006

(22) Filed: Feb. 29, 2012

(65) Prior Publication Data

US 2012/0314357 A1   Dec. 13, 2012

(30) Foreign Application Priority Data

Jun. 10, 2011   (CN) .......................... 2011 1 0155362

(51) Int. Cl.
*H05K 5/00* (2006.01)
*G06F 1/16* (2006.01)
*H05K 7/14* (2006.01)

(52) U.S. Cl.
CPC ................ *H05K 5/00* (2013.01); *H05K 7/1489* (2013.01); *G06F 1/16* (2013.01)
USPC ... 174/50; 174/520; 361/679.02; 361/679.01; 361/826; 211/26

(58) Field of Classification Search
CPC ........... H05K 5/00; H05K 7/14; H05K 14/27; H05K 7/1425; H05K 7/1489; H05K 7/1491; H05K 5/069; H05K 7/1427; H01R 13/518; H01R 9/2416; H02G 15/10; H02G 15/117; H02G 3/08; G06F 1/16

USPC ......... 174/50, 520, 68.3, 68.1, 559, 560, 561, 174/135; 385/134, 135; 439/449, 557, 439/540.1; 361/600, 601, 679.4, 679.01, 361/752, 826, 825, 724, 796; 211/26

See application file for complete search history.

(56) References Cited

U.S. PATENT DOCUMENTS

| | | | | |
|---|---|---|---|---|
| 5,825,962 | A * | 10/1998 | Walters et al. | 385/135 |
| 6,515,227 | B1 * | 2/2003 | Massey et al. | 174/50 |
| 6,522,551 | B2 * | 2/2003 | Hsu et al. | 361/752 |
| 6,556,762 | B1 * | 4/2003 | Erickson et al. | 385/134 |
| 6,981,893 | B2 * | 1/2006 | Barker et al. | 439/540.1 |
| 7,404,736 | B2 * | 7/2008 | Herbst et al. | 439/557 |
| 7,510,421 | B2 * | 3/2009 | Fransen et al. | 439/449 |
| 7,854,624 | B1 * | 12/2010 | Pepe | 439/540.1 |
| 8,119,915 | B2 * | 2/2012 | Regester et al. | 174/68.3 |
| 8,184,938 | B2 * | 5/2012 | Cooke et al. | 385/135 |
| 8,437,147 | B2 * | 5/2013 | Dean et al. | 361/826 |

* cited by examiner

*Primary Examiner* — Angel R Estrada
(74) *Attorney, Agent, or Firm* — Novak Druce Connolly Bove + Quigg LLP

(57) ABSTRACT

A server enclosure includes an enclosure body, a connecting member, and a loading member. The enclosure body includes a bottom wall and two sidewalls extending from the bottom wall. The two sidewalls is substantially parallel to each other. The connecting member includes a top panel and two resisting panels extending from the top panel. The top panel is substantially parallel to the bottom wall. The loading member includes a bottom panel substantially parallel to the top panel and two connecting panels extending from the bottom panel. A cross section of the loading member, taken along a plane parallel to the sidewall, is U-shaped. The bottom panel is secured on the top panel. The loading member is secured between the two sidewalls.

18 Claims, 3 Drawing Sheets

SERVER ENCLOSURE

BACKGROUND

1. Technical Field

The disclosure generally relates to a server enclosure.

2. Description of Related Art

Many servers include an enclosure and a plurality of elements mounted in the enclosure. The enclosure includes a panel having a plurality of openings for receiving cables or guiding airflow. However, openings can weaken the panel, thereby affecting the structural integrity of the enclosure.

Thus, there is room for improvement within the art.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
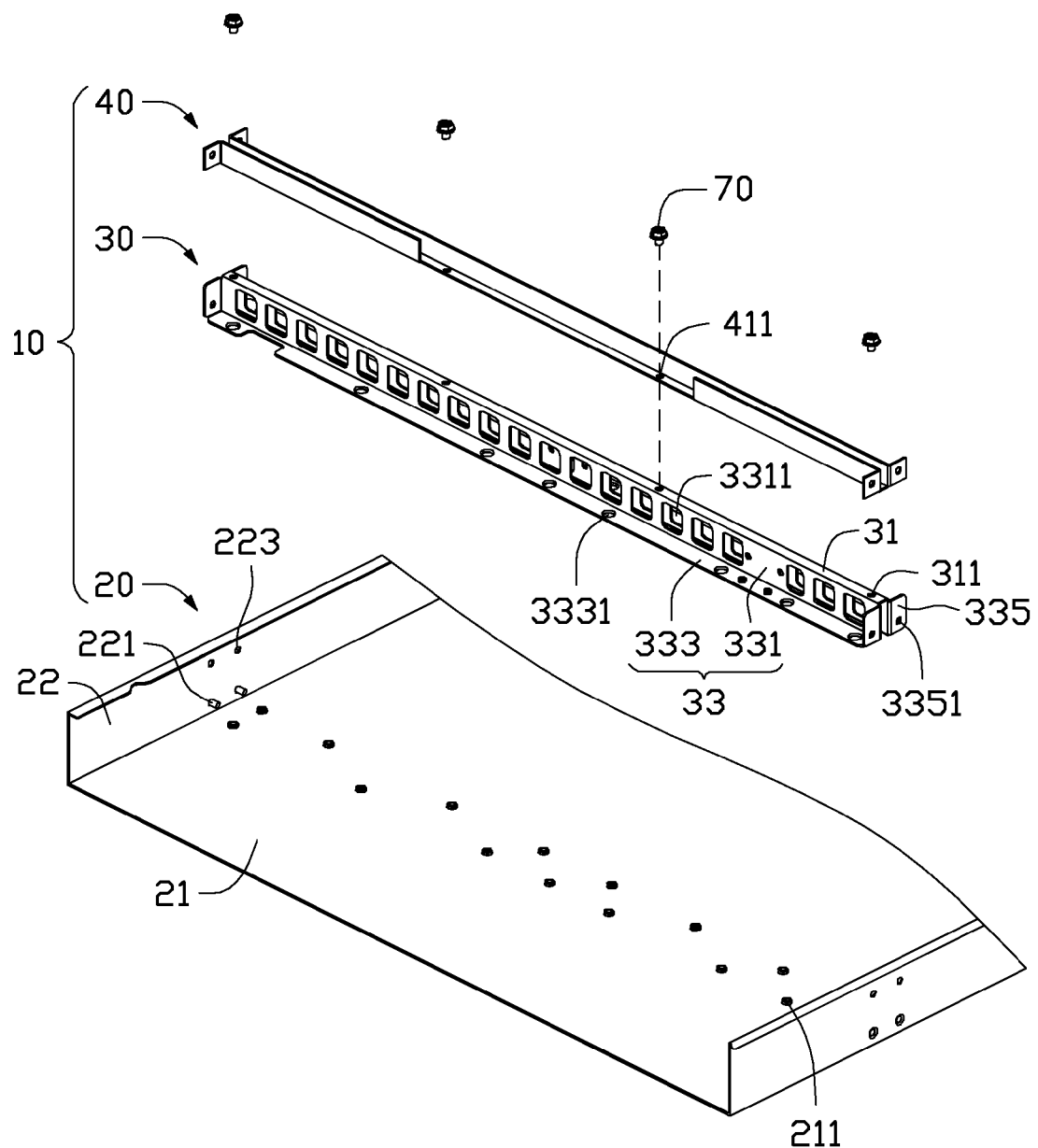
FIG. 1 is an exploded, isometric view of an embodiment of a server enclosure.
Figure 2:
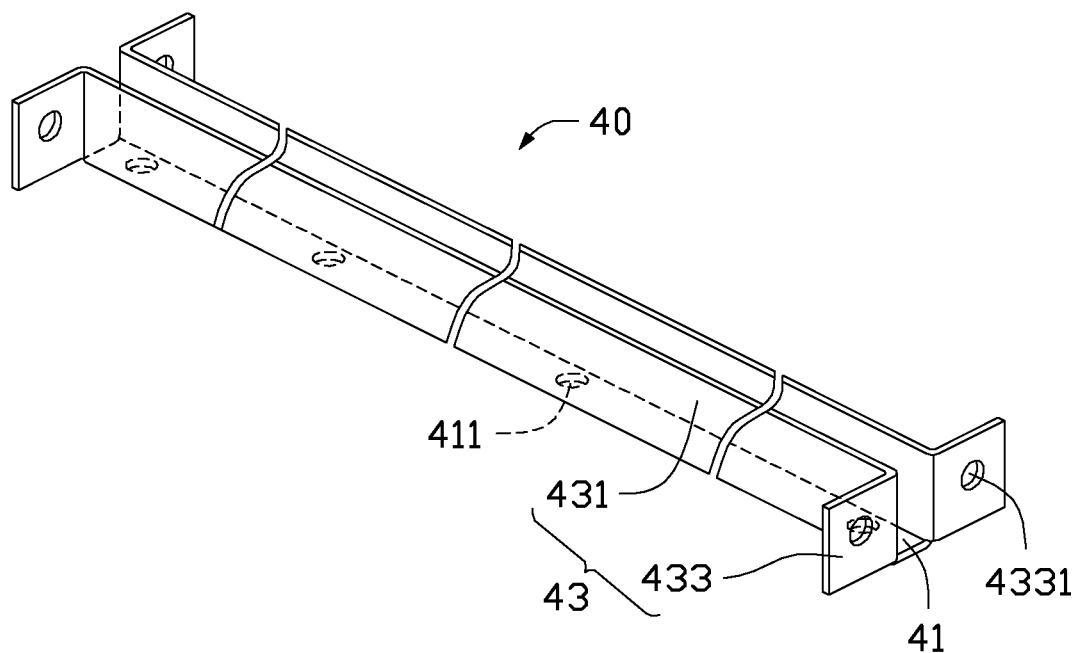
FIG. 2 is an isometric view of a loading member of the server enclosure of FIG. 1.

Referring to FIGS. 1 and 2, one embodiment of a server enclosure includes an enclosure body 20, a connecting member 30, and a loading member 40.

The enclosure body 20 includes a bottom wall 21 and two sidewalls 22 extending perpendicularly from the bottom wall 21. The two sidewalls 22 are parallel to each other. The bottom wall 21 defines a plurality of first mounting holes 211. Each sidewall 22 includes two positioning posts 221. Two first securing holes 223 are defined in each sidewall 22.

The connecting member 30 includes a top panel 31 and two mounting portions 33 extending from opposite edges of the top panel 31. Each mounting portion 33 includes a resisting panel 331 extending perpendicularly from the top panel 31, a securing portion 333 extending perpendicularly from the resisting panel 331. The two resisting panels 331 are parallel to each other. The resisting panel 331 is substantially perpendicular to the bottom wall 21. Each mounting portion 33 further includes two positioning portions 335 extending perpendicularly from opposite edges of each resisting panel 331. A plurality of first screwing holes 311 is defined in the top panel 31. A plurality of openings 3311 is defined in the resisting panel 331. A plurality of second mounting holes 3331 is defined in the securing portion 333 corresponding to the first mounting holes 211. A positioning hole 3351 is defined in the positioning portion 335 corresponding the positioning post 221. The positioning portion 335 is substantially perpendicular to the securing portion 333. The resisting panel 333 is substantially perpendicular to the sidewall 22 and the bottom wall 21.

The loading member 40 includes a bottom panel 41 substantially parallel to the top panel 31 and two connecting portions 43 extending from the bottom panel 41. Each connecting portion 43 includes a connecting panel 431 extending substantially perpendicularly from the bottom panel 41. The connecting panel 431 is substantially perpendicular to the sidewall 22. The two connecting panels 431 are substantially parallel to each other. Each connecting portion 43 further includes two mounting tabs 433 extending from opposite edges of the connecting panel 41. A plurality of second screwing holes 411 is defined in the bottom panel 41. A second securing hole 4331 is defined in each mounting tab 433 corresponding to the first securing hole 223. The mounting tab 433 is substantially parallel to the sidewalls 22. The cross section of the loading member 40 taken along a plane substantially parallel to the sidewall 22 is U-shaped. The length of the connecting panel 431 is substantially equal to a distance between the two sidewalls 22.

Figure 3:
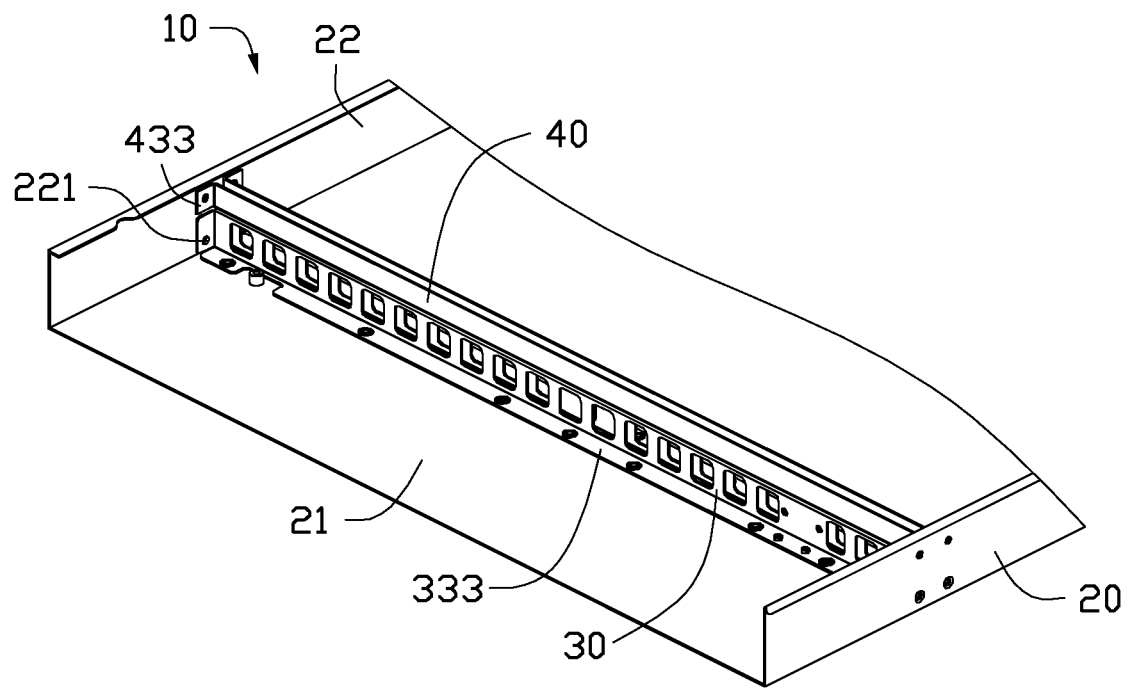
FIG. 3 is an assembled view of the server enclosure of FIG. 1.

Referring to FIG. 3, in assembly, the connecting member 30 is placed on the bottom wall 21 of the enclosure body 20 to enable the positioning posts 221 of the enclosure body 20 to pass through the positioning holes 3351 of the connecting member 30. The second mounting holes 3331 of the connecting member 30 are aligned with the first mounting holes 211 of the bottom wall 21. A plurality of screws (not shown) is screwed into the first mounting holes 3331 and the first mounting holes 211 to secure the connecting member 30 to the bottom wall 21. The bottom panel 41 of the loading member 40 is placed on the top panel 31 of the connecting member 30 to enable the first screwing holes 311 to be aligned with the second screwing holes 411 of the loading member 40. At this time, the second securing holes 4331 of the loading member 40 are aligned with the first securing holes 223 of the enclosure body 20. A plurality of screws 70 is screwed into the second screwing holes 411 and the first screwing holes 311 to secure the loading member 40 and the connecting member 30 together. A plurality of fasteners (not shown) is fastened into the second securing holes 4331 and the first securing holes 223 to secure the loading member 40 to the enclosure body 20.

The loading member 40 is secured on the connecting member 30. The loading member 40 is capable of protecting the connecting member 30 from being deformed when pressure is applied to the server enclosure 10. In addition, the loading member 40 and the connecting member 30 are secured between the two sidewalls 22, thereby protecting the enclosure body 20 from being deformed when pressure is applied to the enclosure body 20.

It is to be understood, however, that even though numerous characteristics and advantages have been set forth in the foregoing description of embodiments, together with details of the structures and functions of the embodiments, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. A server enclosure comprising:
an enclosure body, the enclosure body comprising a bottom wall and two sidewalls extending from the bottom wall; wherein the two sidewalls being substantially parallel to each other;
a connecting member, the connecting member comprising a top panel and two resisting panels extending from the top panel; wherein the top panel is substantially parallel to the bottom wall; and
a loading member, the loading member comprising a bottom panel substantially parallel to the top panel and two connecting panels extending from the bottom panel; and a cross section of the loading member, taken along a plane parallel to the sidewall, is U-shaped, the bottom panel is secured on the top panel, and the loading member is secured between the two sidewalls;

wherein a first mounting hole is defined in the bottom wall, a securing portion extends from each resisting panel, and a second mounting hole is defined in the securing portion corresponding to the first mounting hole.

2. The server enclosure of claim 1, wherein the loading member further comprises two mounting tabs extending from two ends of each connecting panel; two first securing holes are defined in each sidewall; and a second securing hole is defined in each tab corresponding to the first securing hole.

3. The server enclosure of claim 2, wherein the two mounting tabs are substantially parallel to the sidewall.

4. The server enclosure of claim 3, wherein the connecting panel is substantially perpendicular to the sidewall.

5. The server enclosure of claim 1, wherein a first securing hole is defined in the top panel, and a second securing hole is defined in the bottom panel corresponding to the first securing hole.

6. The server enclosure of claim 1, wherein the connecting member further comprises two positioning portions extending from two ends of each resisting panel; a positioning hole is defined in each positioning portion; and each sidewall comprises two positioning posts corresponding to the positioning holes.

7. The server enclosure of claim 6, wherein the positioning portion is substantially perpendicular to the securing portion.

8. The server enclosure of claim 1, wherein the resisting panel is substantially perpendicular to the sidewall.

9. The server enclosure of claim 1, wherein the two connecting panels are substantially perpendicular to the bottom panel and are substantially parallel to each other.

10. A server enclosure comprising:
an enclosure body, the enclosure body comprising a bottom wall and two sidewalls extending from the bottom wall;
a connecting member located between the two sidewalls, the connecting member comprising a top panel and two resisting panels extending from the top panel in a first direction; wherein the two resisting panels contact the bottom wall; and
a loading member secured to the connecting member, the loading member comprising a bottom panel, that is substantially parallel to the top panel, and two connecting panels, extending from the bottom panel in a second direction that is substantially opposite to the first direction; wherein the bottom panel is in contact the top panel;
wherein a first mounting hole is defined in the bottom wall, a securing portion extends from each resisting panel, and a second mounting hole is defined in the securing portion corresponding to the first mounting hole.

11. The server enclosure of claim 10, wherein the loading member further comprises two mounting tabs extending from two ends of each connecting panel; two first securing holes are defined in each sidewall; and a second securing hole is defined in each tab corresponding to the first securing hole.

12. The server enclosure of claim 11, wherein the two mounting tabs are substantially parallel to the sidewall.

13. The server enclosure of claim 12, wherein the connecting panel is substantially perpendicular to the sidewall.

14. The server enclosure of claim 10, wherein a first securing hole is defined in the top panel, and a second securing hole is defined in the bottom panel corresponding to the first securing hole.

15. The server enclosure of claim 10, wherein the connecting member further comprises two positioning portions extending from two ends of each resisting panel; a positioning hole is defined in each positioning portion; and each sidewall comprises two positioning posts corresponding to the positioning holes.

16. The server enclosure of claim 15, wherein the positioning portion is substantially perpendicular to the securing portion.

17. The server enclosure of claim 10, wherein the resisting panel is substantially perpendicular to the sidewall.

18. The server enclosure of claim 10, wherein the two connecting panels are substantially perpendicular to the bottom panel and are substantially parallel to each other.

* * * * *